(12) United States Patent
Boyd et al.

(10) Patent No.: US 6,245,619 B1
(45) Date of Patent: Jun. 12, 2001

(54) DISPOSABLE-SPACER DAMASCENE-GATE PROCESS FOR SUB 0.05 μM MOS DEVICES

(75) Inventors: Diane Catherine Boyd, Lagrangeville, NY (US); Hussein Ibrahim Hanafi, Basking Ridge, NJ (US); Wesley Charles Natzle, New Paltz, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/488,806

(22) Filed: Jan. 21, 2000

(51) Int. Cl.[7] ................................. H01L 21/336
(52) U.S. Cl. ................................................ 438/289
(58) Field of Search ........................... 438/289, 290–291, 438/301–307, 713, 960

(56) References Cited

U.S. PATENT DOCUMENTS 5,736,446 * 4/1998 Wu ........................................ 438/305

OTHER PUBLICATIONS

Nowak, et al., (1997), "CMOS Devices below 0.1 m: How High Will Performance Go?", IEEE, IBM Research, Yorktown Heights, NY and Microelectronics Division, Essex Junction, VT, pp. 9.1.1–9.1.4.

* cited by examiner

*Primary Examiner*—Charles Bowers
*Assistant Examiner*—Craig Thompson
(74) *Attorney, Agent, or Firm*—Scully, Scott, Murphy & Presser; Casey P. August

(57) ABSTRACT

Techniques to fabricate sub-0.05 μm MOSFET devices with Super-Halo doping profile which provide excellent short-channel characteristics are provided. The techniques utilize a damascene-gate process to obtain MOSFET structures with oxide thickness above the source/drain region independent of the gate-oxide thickness and a disposable-spacer technique for the formation of the Super-Halo doping profile.

27 Claims, 7 Drawing Sheets

DISPOSABLE-SPACER DAMASCENE-GATE PROCESS FOR SUB 0.05 µM MOS DEVICES

FIELD OF THE INVENTION

The present invention relates to methods of fabricating metal oxide semiconductor field effect transistor (MOSFET) devices, and more particular to methods of fabricating MOSFET devices having a "Super-Halo" doping profile which provide excellent short-channel characteristics. The methods of the present invention are compatible with main stream CMOS (Complementary Metal Oxide Semiconductor) processes and are capable of forming very high performance MOSFETs of scaled-down size, in particular MOSFETs having a size that is smaller than 0.05 µm.

BACKGROUND OF THE INVENTION

In the field of MOSFET device manufacturing, it is well known that in order to scale MOSFET devices below 0.05 µm, the short channel effect problem has to be controlled with the use of a Super-Halo doping profile. This is described, for example, in Y. Taur, et al., "CMOS Devices Below 0.1 µm; How High Will Performance Go?", 1997 IEDM Technical Digest, pp. 215–218. The Super-Halo doping consists of a highly non-uniform profile in both the vertical and the lateral directions. This non-uniform doping profile is seen, for example, in FIG. 1A and simulated $I_{on}/I_{off}$ characteristics (25° C.) of a 0.05 µm design with ±30% channel length tolerances are shown in FIG. 1B. As is shown in FIG. 1A, pockets of high-doped regions are self-aligned to the gate and source/drain regions which help shield the gate-controlled depletion region from penetrating the source and drain fields. Superior short-channel, $V_t$, control down to very short channel lengths (<0.035 µm) can be achieved with such an idealistic non-uniform doping profile.

To obtain Super-Halo doping profiles in MOSFETs, the thermal budget used to produce the structure, after halo implantation, has to be minimized, i.e., 1000° C., 1 sec. Utilizing a nitride disposable-spacer technique in processing MOSFET devices will result in minimizing the thermal budget used after halo implants. This prior art technique can be summarized as follows: After poly-gate definition and re-oxidation, nitride spacers (about 100 nm) are formed on the sidewalls of the polysilicon. Source, drain and gate implants are then performed followed by the required doping activation and drive-in anneals (1000° C., 5 seconds). The nitride spacers are subsequently removed (hence the name disposable-spacer) and the source and drain extensions (SDE) and the halo implants are performed. In order to activate the halo and SDE implants while minimizing any lateral (and vertical) diffusion, a very short channel anneal cycle (1000° C., 1 sec) is performed. This very short channel anneal cycle preserves the as-implanted abrupt profile of the halo doping obtaining the Super-Halo doping profile described hereinabove.

main problem with the above prior art technique arises from the way in which the nitride spacers are removed when applied to sub-0.05 µm MOSFET devices with very thin gate oxides (≦2 nm). The following two methods are currently employed in the prior art for removing nitride spacers: (1) A wet etch, using, for example, hot phosphoric acid; or (2) A dry etch using, for example, a Chemical Down-stream Etch (CDE) technique.

Both of the above etching processes do not exhibit good etch selectivity between nitride and doped oxide or doped silicon. An etch selectivity of 100:1 or greater (nitride to doped oxide or doped silicon) is required to remove the 100 nm nitride spacer without complete removal of the 2 nm oxide that is formed over the source and drain areas. The present etch selectivity of these techniques is in the order of 10:1.

This problem is clearly demonstrated in FIGS. 2 and 3. Specifically, FIG. 2 shows a sketch of a prior art MOSFET structure before spacer etch. The oxide over the source and drain areas is of the same thickness as the gate oxide (≦2 nm). This oxide has also been doped during the source/drain implant step. Upon removing the disposable-nitride spacers, the oxide over the source and drain areas are etched and the source/drain areas are attacked resulting in the MOSFET structure (sketch) shown in FIG. 3.

One obvious solution to the above problem is to increase the oxide thickness over the source and drain areas independent of the gate-oxide thickness (e.g., for the removal of 100 nm nitride spacer, greater than 10 nm of oxide is required over the source and drain areas). This may be done by using a thermal oxidation step after the nitride spacer formation to build-up the oxide over the source/drain areas to the required thickness. Unfortunately, such a technique would result in increased dopant diffusion from the source/drain regions to the thermally grown oxide increasing its etch rate to wet or CDE etches.

In view of the drawbacks with prior art MOSFET fabrication methods, there is a continued need to provide new and improved methods of fabricating MOSFET devices with a Super-Halo doping profile that provide excellent device short channel characteristics and enhanced device performance.

SUMMARY OF THE INVENTION

One object of the present invention is to provide methods of fabricating sub-0.05 µm MOSFET devices having a Super-Halo doping profile.

Another object of the present invention is to provide methods of fabricating scaled-down MOSFET devices (i.e., sub-0.05 µm) which have excellent device short channel characteristics and enhanced device performance.

A still further object of the present invention is to provide methods of fabricating sub-0.05 µm MOSFET devices in which the process technique employed in fabricating same is completely compatible with main stream CMOS processing techniques.

A yet further object of the present invention is to provide methods of fabricating sub-0.05 µm MOSFET devices wherein the oxide above the source/drain regions is not sufficiently removed and wherein the processing steps do not cause a sufficient increase in dopant diffusion from the source/drain regions to the oxide regions above the same. By preventing the increase in dopant diffusion from the source/drain regions into the oxide regions above the source/drain regions, the etch rate of the oxide region is not increased; therefore a structure such as shown in FIG. 3 of the present application is not formed.

These and other objects and advantages can be achieved in the present invention by utilizing processing schemes wherein a damascene-gate technique is employed in fabricating MOSFET structures in which the oxide thickness above the source/drain regions are independent of the gate-oxide thickness and wherein a disposable-spacer technique is employed for the formation of a Super-Halo doping profile.

One method of the present invention which achieves the above objectives comprises the steps of:

(a) providing a structure having a gate stack formed on a surface of a substrate, said gate stack comprising at least a pad oxide layer formed on said surface of said and a first nitride layer formed on said pad oxide layer;

(b) forming at least one isolation trench region in said structure, said at least one isolation trench region being formed in said gate stack and a portion of said substrate;

(c) forming an oxide liner in said at least one isolation trench region;

(d) filling said at least one isolation trench region with a trench dielectric material;

(e) forming well implant regions in said substrate;

(f) forming a second nitride layer on said first nitride layer of said gate stack, wherein the total thickness of the first nitride layer and the second nitride layer is substantially equal to the thickness of a gate region to be formed subsequently therein;

(g) forming a gate hole in said first and second nitride layers stopping on said pad oxide layer;

(h) removing said pad oxide layer in said gate hole exposing a portion of said substrate;

(i) forming a thin oxide layer in said gate hole on said exposed portion of said substrate, said thin oxide layer having a thickness of 3 nm or less;

(j) filling said gate hole with polysilicon;

(k) removing said first and second nitride layers so as to expose sidewalls of said polysilicon;

(l) oxidizing the exposed sidewalls of said polysilicon including the top surface thereof;

(m) forming nitride spacers on said oxidized sidewalls of said polysilicon;

(n) forming source and drain regions in said substrate, wherein said source and drain regions are activated using an annealing temperature of 1000° C. or greater for a time period of 5 seconds or greater;

(o) removing said nitride spacers; and (p) forming source/drain extensions and halo implant regions in said substrate, wherein said halo implant regions are activated by annealing at a temperature of 1000° C. or lower for a time period of 1 second or less.

In an optional embodiment of the first method of the present invention, the source/drain extensions are formed between steps (l) and (m) mentioned above. In such an embodiment, only the halo implant is then formed in step (p).

A second method of the present invention which achieves the above objectives comprises the steps of:

(a) providing a structure having a gate stack formed on a surface of a substrate, said gate stack comprising at least a pad oxide layer formed on said surface of said substrate and a first nitride layer formed on said pad oxide layer;

(b) forming at least one isolation trench region in said structure, said at least one isolation trench region being formed in said gate stack and a portion of said substrate;

(c) forming an oxide liner in said at least one isolation trench region;

(d) filling said at least one isolation trench region with a trench dielectric material;

(e) forming well implant regions in said substrate;

(f) planarizing the trench dielectric material;

(g) removing said first nitride layer stopping on said pad oxide layer;

(h) forming a second nitride layer over said pad oxide layer, said second nitride layer having a thickness substantially equal to the thickness of a gate region to be formed subsequently therein;

(i) forming a gate hole in said second nitride layer stopping on said pad oxide layer;

(j) removing said pad oxide layer in said gate hole exposing a portion of said substrate;

(k) forming a thin oxide layer in said gate hole on said exposed portion of said substrate, said thin oxide layer having a thickness of 3 nm or less;

(l) filling said gate hole with polysilicon;

(m) removing said second nitride layer so as to expose sidewalls of said polysilicon;

(n) oxidizing the exposed sidewalls of said polysilicon including the top surface thereof;

(o) forming nitride spacers on said oxidized sidewalls of said polysilicon;

(p) forming source and drain regions in said substrate, wherein said source and drain regions are activated using an annealing temperature of 1000° C. or greater for a time period of 5 seconds or greater;

(q) removing said nitride spacers; and (r) forming source/drain extensions and halo implant regions in said substrate, wherein said halo implant regions are activated by annealing at a temperature of 1000° C. or lower for a time period of 1 second or less.

In an optional embodiment of the second method of the present invention, the source/drain extensions are formed between steps (n)–(o) mentioned above. In such an embodiment, step (r) would only include formation of the halo implant region.

DETAILED DESCRIPTION OF THE INVENTION

Figure 1A:
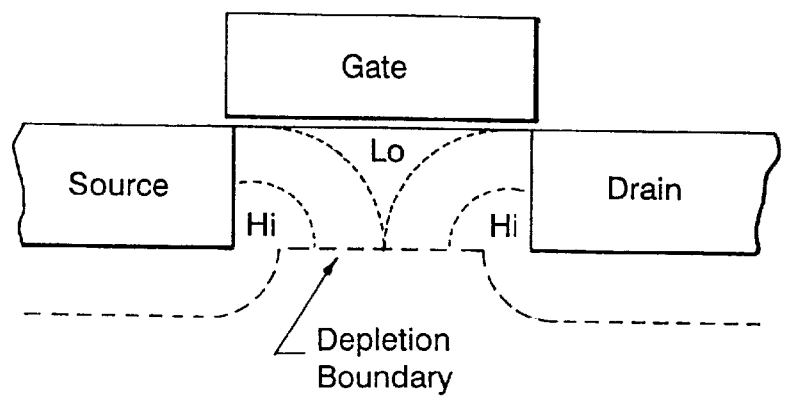
FIG. 1A is a cross-sectional view showing the doping countors of a prior art Super-Halo profile.
Figure 1B:
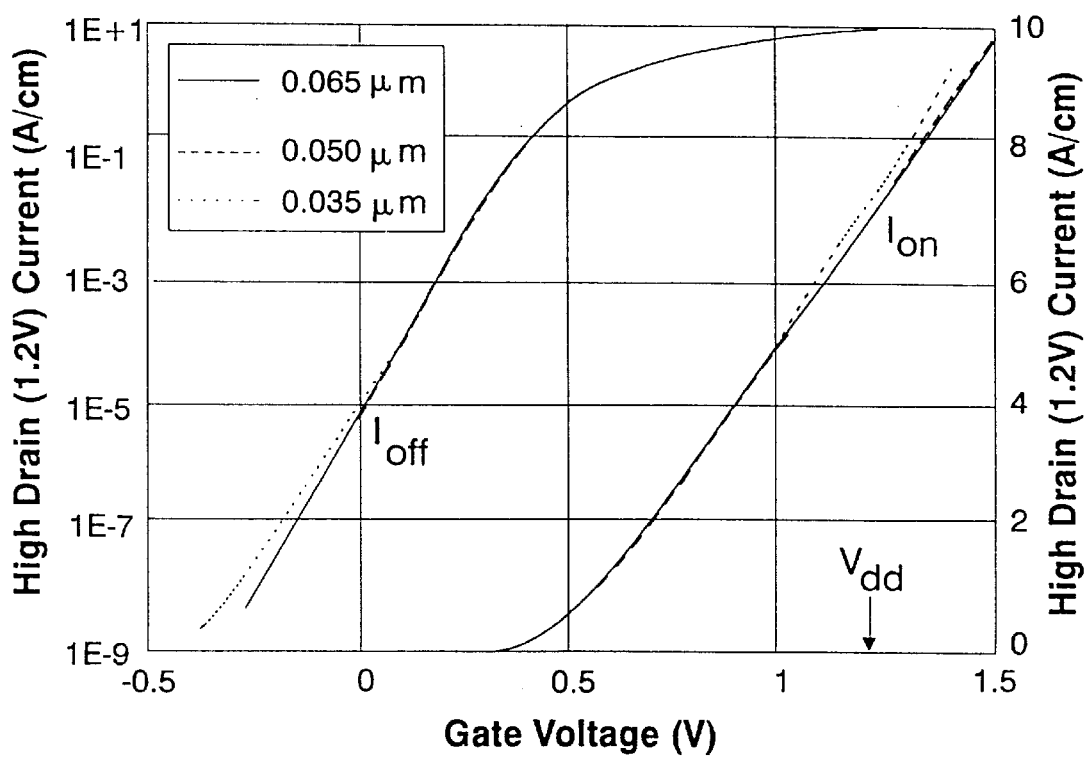
FIG. 1B is a graph illustrating the simulated $I_{on}$, $I_{off}$ characteristics (25° C.) of a 0.05 $\mu$m design with ±30% channel length tolerances.
Figure 2:
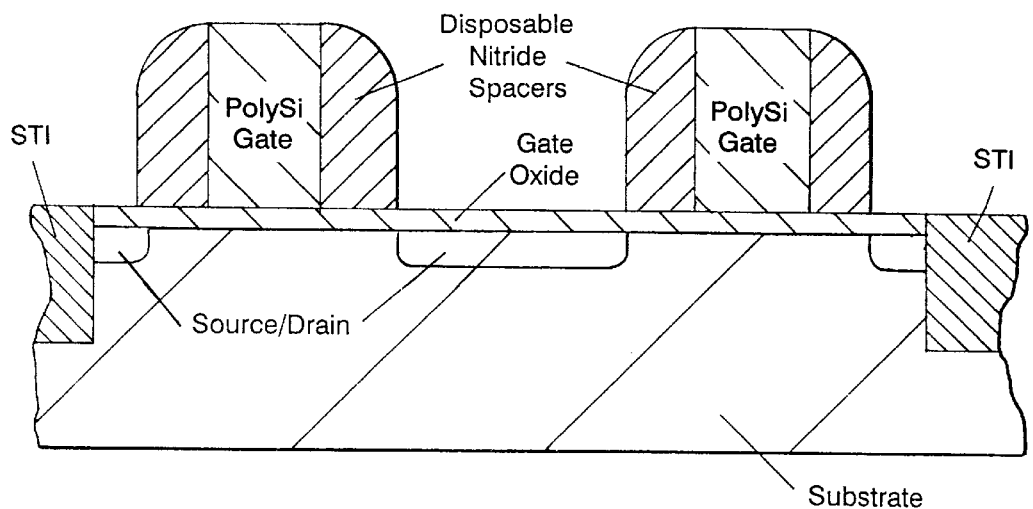
FIG. 2 is a cross-sectional view illustrating a prior art MOSFET structure before the nitride spacer etch.
Figure 3:
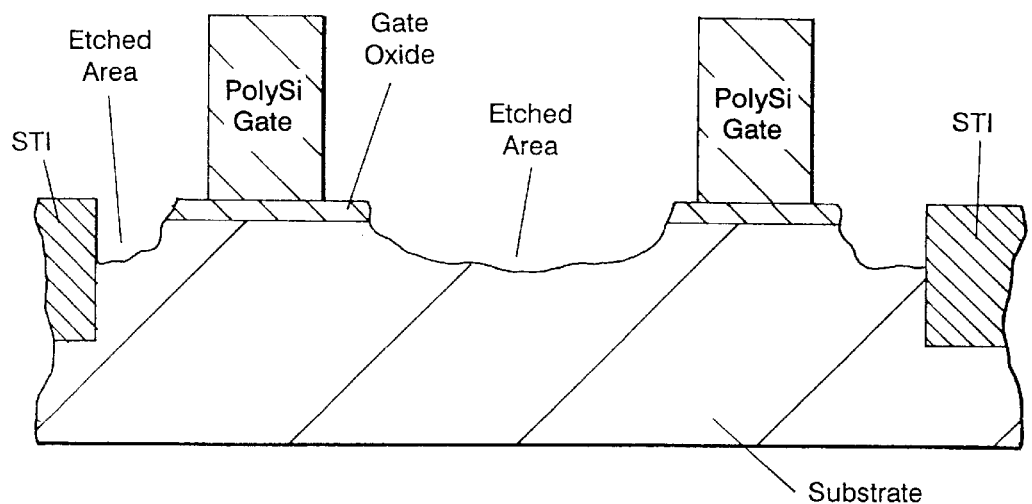
FIG. 3 is a cross-sectional view illustrating a prior art MOSFET after etching the nitride spacer.

The present invention, which provides a method of fabricating sub-0.05 $\mu$m MOSFETs having a Super-Halo doping profile, excellent device short channel characteristics and enhanced device performance, will now be described in greater detail by referring to the drawings that accompany the present application. It should be noted that in the drawings accompanying the present application like and/or corresponding elements are referred to by like reference numerals.

Reference is made to FIGS. 4A–4M which illustrate the basic processing steps that are employed in the first method of the present invention. Specifically, FIGS. 4A–4M are cross-sectional views of one possible MOSFET device that can be formed utilizing the first method of the present invention.

Figure 4A:
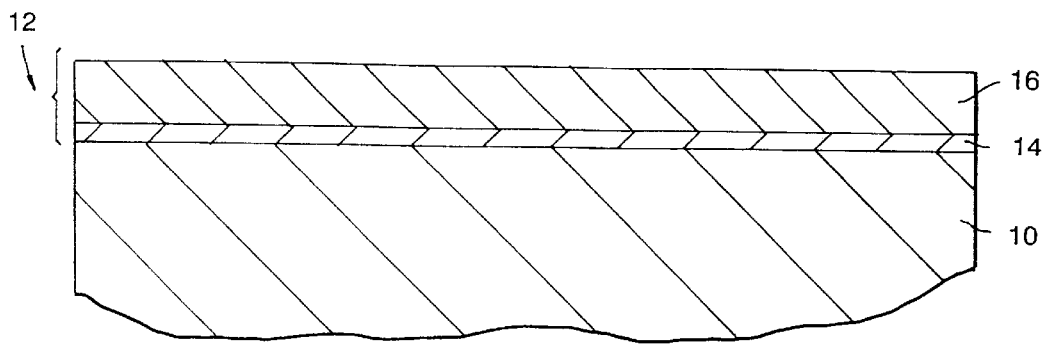
FIGS. 4A–4M are cross-sectional views illustrating the various processing steps of the first method of the present invention.
Figure 4B:
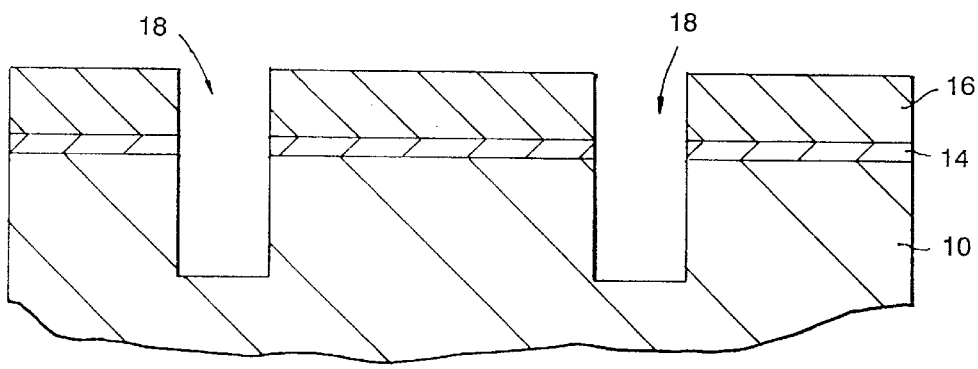

FIG. 4A shows an initial structure that is formed from step (a) of the present invention. The initial structure comprises a substrate 10 and a gate stack 12. The gate stack includes a pad oxide layer 14 such as $SiO_2$ which is formed on the surface of substrate 10 and a nitride layer 16 such as $Si_3N_4$ that is formed on the pad oxide layer. Although the drawings of the present invention depict a gate stack comprising two material layers, the gate stack may also comprise additional material layers. In the embodiment in the drawings of the present invention, nitride layer 16 is used;in defining the isolation trench, therefore that layer will be removed by a subsequent etching step to expose the gate region of the structure—the pad oxide layer remains on portions of the substrate after removal of the nitride layer.

Pad oxide layer 14 is formed on the surface of substrate 10 using a conventional thermal growing process, or alternatively, the pad oxide layer may be formed by a conventional deposition process such as, but not limited to: chemical vapor deposition (CVD), plasma-assisted CVD, sputtering, evaporation and other like deposition processes. The thickness of the pad oxide layer may vary, but it should be thicker than the corresponding gate oxide which will be formed in a subsequent processing step. Typically, the pad oxide layer has a thickness of from about 8 to about 20 nm.

Insofar as nitride layer 16 is concerned, that layer is formed on the surface of pad oxide layer 14 utilizing conventional deposition processes well known in the art, including the same as mentioned hereinabove in forming the pad oxide layer. The thickness of the nitride layer may vary, but it should be thicker than the pad oxide in which it is formed thereon. Typically, in the present invention, nitride layer 16 of gate stack 12 has a thickness of from about 50 to about 200 nm.

The substrate employed in the present invention may be any conventional semiconductor substrate in which a semi-conducting material such as silicon is present therein. Examples of some substrates that may be employed in the present invention include, but are not limited to: Si, Ge, SiGe, GaP, InAs, InP and all other III/V compound semi-conductors. The substrate may also be composed of a layered semiconductor such as Si/SiGe. The substrate may be of the n-type or p-type depending on the desired device to be fabricated. The substrate may contain various active and/or isolation regions either formed on the substrate or formed in the substrate using processing techniques that are well known in the art. A preferred substrate employed in the present invention is a Si wafer or chip.

After forming gate stack 12 on substrate 10, an isolation trench (or plurality thereof) 18 is formed in the structure shown in FIG. 4A. The isolation trenches are formed through nitride layer 16, pad oxide layer 14 and a portion of substrate 10. Isolation trenches 18 are formed using conventional lithography and etching (reactive-ion etching (RIE), plasma etching, ion beam etching and other like dry etch processes), see FIG. 4B. The isolation trench regions formed in this step of the present invention become the shallow trench isolation regions of the final structure. Although not shown in the drawings, the lithography step employs a conventional photoresist and optionally an anti-reflective coating, both of which are removed after the isolation trench has been formed in the structure.

Figure 4C:
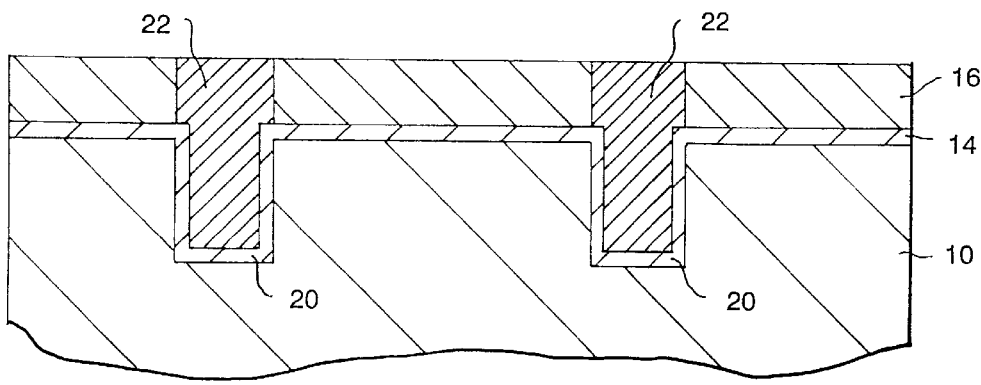

An oxide liner, e.g., $SiO_2$, 20 is then formed in isolation trench regions 18 so as to line the sidewalls and bottom of each trench. The structure including the oxide liner is shown in FIG. 4C; FIG. 4C also includes the structure which is formed after isolation trench fill and planarization. As is shown in FIG. 4C, the oxide liner forms a continuous layer with the top surface of the pad oxide; therefore, the entire bottom portion of the isolation trench is isolated from substrate 10. liner 20 may be formed using any conventional deposition or thermal growing process including the same as mentioned hereinabove in forming pad oxide layer 14. The thickness of oxide liner 20 may vary depending on the processing technique used in forming the same, but a typical thickness range of the oxide liner is from about 5 to about 20 nm.

As mentioned hereinabove, FIG. 4C also illustrates the structure that is formed after filling isolation trenches 18 with a trench dielectric material 22 and planarization. Specifically, after the bottom portions of the isolation trenches have been lined with oxide liner 20, a trench dielectric material 22 is formed on the surface of nitride layer 16 and in isolation trench regions 18. The filling process employed in the present invention comprises any conventional deposition process including, but not limited to: CVD and plasma-assisted CVD. Suitable trench dielectric materials that may be employed in this step of the present invention include: any conventional dielectric material. Examples of some suitable trench dielectric materials that can be used in the present invention include, but are not limited to: tetraethylorthosilicate (TEOS), $SiO_2$, flowable oxides and other like dielectric materials. When TEOS is used as the trench dielectric material, an optional densification step may be employed prior to planarization.

The planarization process employed in forming the structure shown in FIG. 4C comprises any conventional planarization technique known to those skilled in the art including, but not limited to: chemical-mechanical polishing (CMP) and grinding.

Figure 4D:
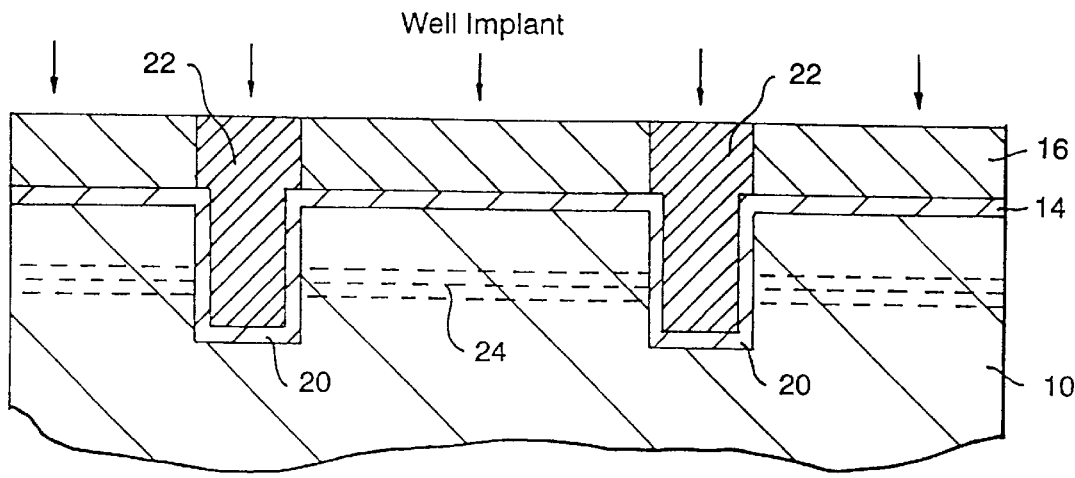

Next, as shown in FIG. 4D, deep well implant regions 24 are formed in the substrate using conventional implantation processes well known to those skilled in the art which are capable of forming deep well implants. The implantation process may form P-wells, N-wells or both P-and N-wells in the substrate. The deep well implants are activated using conventional annealing processes well known in the art which are capable of activating the same.

Figure 4E:
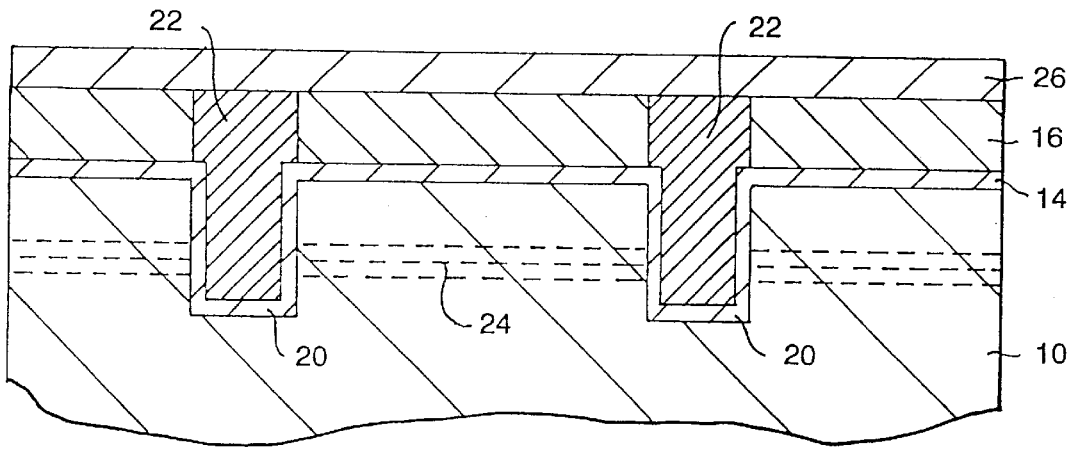

After the formation of the deep well implants, second nitride layer 26 is formed over nitride layer 16 of gate stack 12 utilizing the same or different conventional deposition process as was used in forming the nitride layer of the gate stack, See FIG. 4E. The thickness of this nitride layer combined with the thickness of the previous nitride layer of gate stack 12 is substantially equal to the thickness of the corresponding gate region to be subsequently formed in the structure. That is, the combined thickness of nitride layers 16 and 26 is from about 5 to about 200 nm, with a combined thickness of from about 10 to about 150 nm being more preferred. It is noted that nitride layers 16 and 26 are used in forming the gate region; therefore, the total thickness of the same should be equal to the total desired height of the gate region.

Figure 4F:
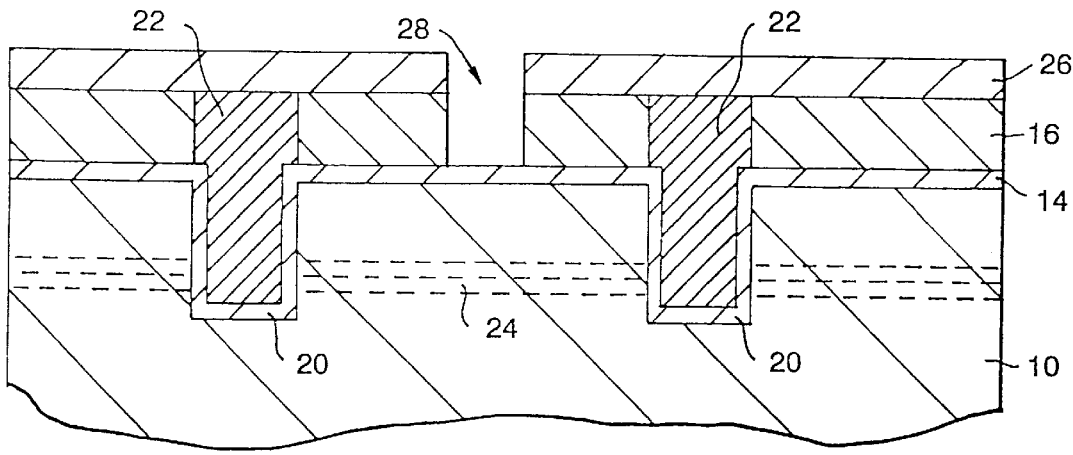

The next step of the first method of the present invention includes the formation of gate hole 28 in nitride layers 16 and 26, See FIG. 4F. Specifically, the gate hole is formed in the structure of FIG. 4E utilizing conventional lithography and etching (reactive-ion etching (RIE), plasma-etching, ion beam etching and other like dry etching processes) providing the structure shown in FIG. 4F. As is shown therein, the gate hole extends through the nitride layers stopping on the pad oxide layer thereby exposing a portion of pad oxide layer 14 in the bottom of gate hole 28. A conventional photoresist is employed in defining the gate hole and is removed after fabricating the same. Although the drawings depict the formation of only one gate hole in the structure, a plurality of gate holes are also contemplated herein.

Figure 4G:
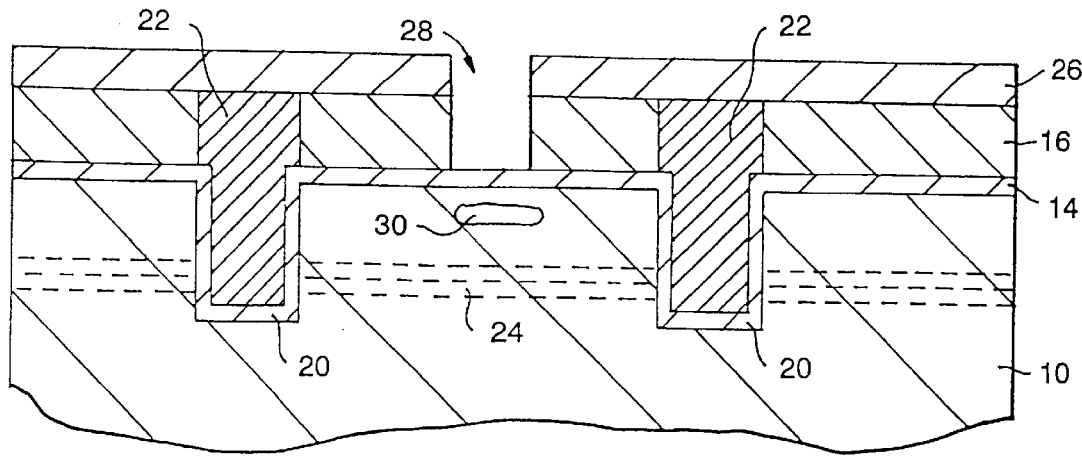

Following gate hole formation, an optional threshold adjust implant step may be performed utilizing conventional ion implantation and an activation anneal; both of these processes are well known to those skilled in the art. This optional step of the present invention is shown in FIG. 4G of the present invention wherein region 30 represents the threshold adjust implant region formed in the structure.

Figure 4H:
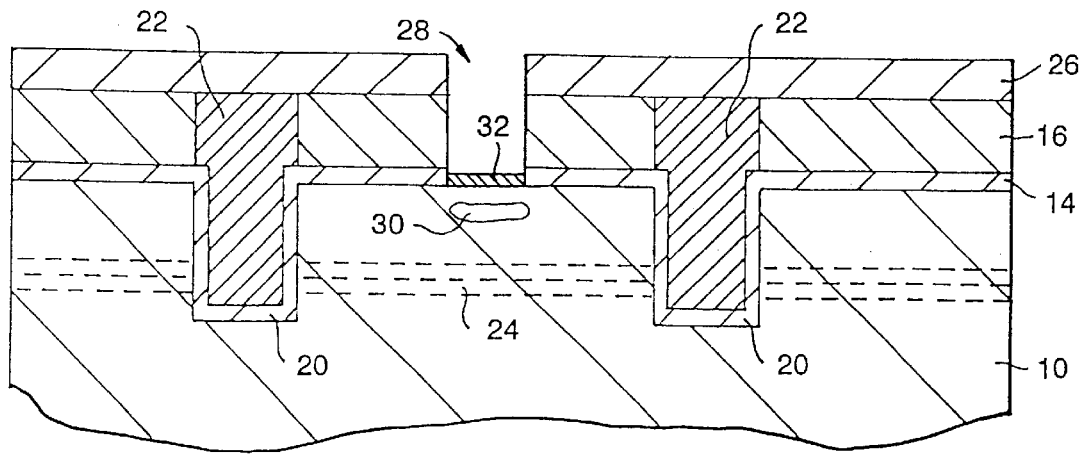

After gate hole formation and optional threshold adjust implant formation, pad oxide layer 14 in the bottom of gate hole 28 is removed by an etch process which is highly selective in removing oxide, See FIG. 4H. This step of the present invention exposes a portion of substrate 10 in the gate hole. One highly preferable etch process that can be used in the present invention in removing the pad oxide layer from the bottom of the gate hole is a vapor phase chemical oxide removal process wherein a vapor of HF and $NH_3$ is employed as the etchant and low presssures (6 millitorr or below) are used.

FIG. 4H also shows a step of forming a thin oxide layer 32 (thickness of 3 nm or less) in the bottom portion of the gate hole in which the pad oxide layer has been previously removed. That is, the thin oxide is formed on the surface of substrate 10 that is exposed during the removal of pad oxide layer 14. It is noted that oxide layer 32 represents the gate oxide of the structure. This oxide layer is formed utilizing conventional gate oxidation processes that are well known to those skilled in the art. For example, oxide layer 32 may be formed by subjecting the structure to an oxidizing atmosphere, e.g., air or oxygen, at a temperature of from about 700° to about 800° C. for a time period of from about 5 to about 10 minutes. The heating may be performed at a single temperature or various ramp and soak cycles may be employed. Although reference is given to the above oxidation conditions, other temperatures and times are also contemplated herein so long as the other temperatures and times are sufficient in forming a thin oxide layer in the bottom of the exposed gate hole. It is also within the contemplation of the present invention to employ a conventional rapid thermal oxidation (RTO) process.

Figure 4I:
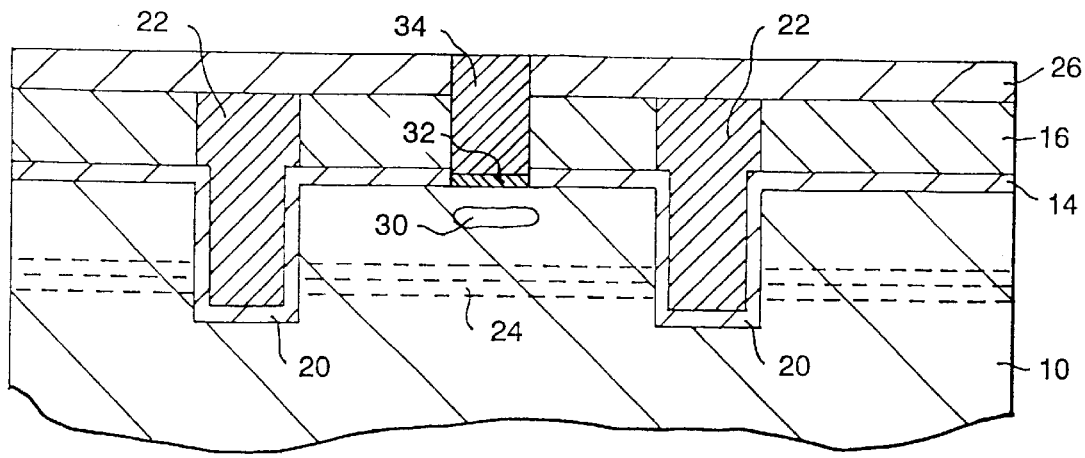

After formation of gate oxide 32 in the bottom of gate hole 28, the gate hole is filled with polysilicon 34 utilizing a conventional deposition process such as CVD or plasma-CVD and the structure is then planarized by conventional processes, e.g., CMP, stopping on nitride layer 26. This planarized structure is shown in FIG. 4I.

Figure 4J:
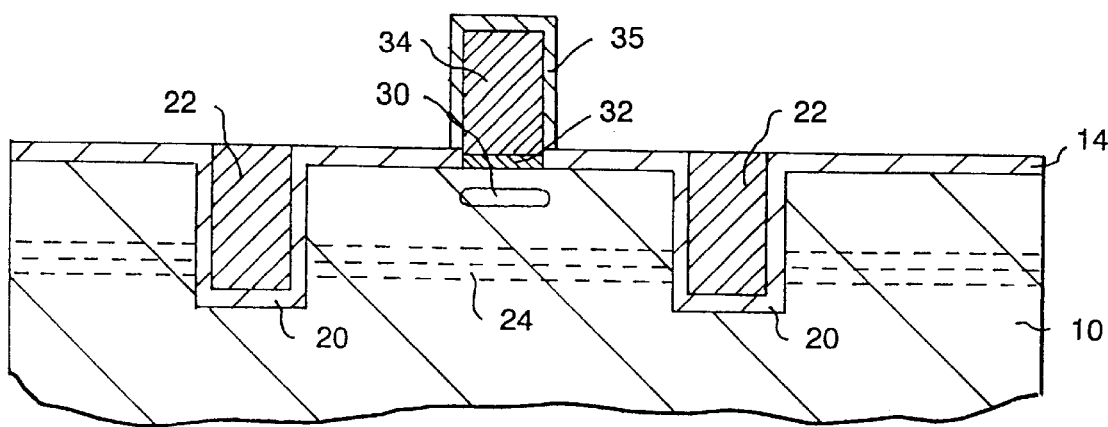

In accordance with the next step of the first method of the present intention, which is illustrated in FIG. 4J, nitride layers 26 and 16 are removed by a conventional damascene etch back process which includes the use of a wet etch process. The damascene etch back process results in the structure shown in FIG. 4J in which the sidewalls of the gate region, i.e., polysilicon 34, are exposed. The wet etch process employed in this step of the present invention is carried out in the presence of a chemical etchant such as, but not limited to: hot phosphoric acid. Other chemical etchants as well as dry etching may also be employed in the present invention.

Following removal of nitride layers 16 and 26 and subsequent exposing of the sidewalls of polysilicon 34, a polyoxidation step is carried out which forms oxide regions 35 in the exposed sidewalls of polysilicon 34 as well as in the top surface of polysilicon 34, See FIG. 4J. The oxide regions that are formed in the polysilicon serve to protect the remaining polysilicon from chemical attack during removal of the disposable spacers. Oxide regions 35 are formed using the same or different oxidation technique as is used in forming oxide region 32.

Figure 4K:
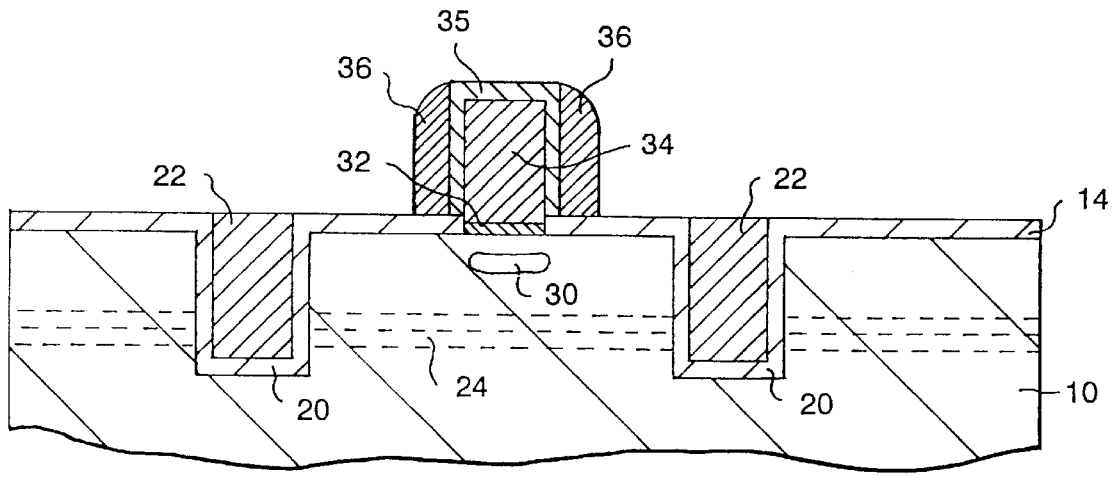

Next, nitride spacers 36 are formed on the oxidized sidewalls of polysilicon 34, See FIG. 4K. The nitride spacers employed in the present invention are composed of conventional nitride-containing materials such as, but not limited to: $Si_3N_4$. The spacers are formed utilizing conventional deposition processes well known in the art and are then etched by RIE. The nitride spacers employed in the present invention are disposable-spacers since they are removed in a subsequent processing step. The thickness of nitride spacers 36 may vary depending on the deposition process employed in fabricating the same, but typically in the present invention, the thickness of the nitride spacers is from about 100 to about 150 nm.

Figure 4L:
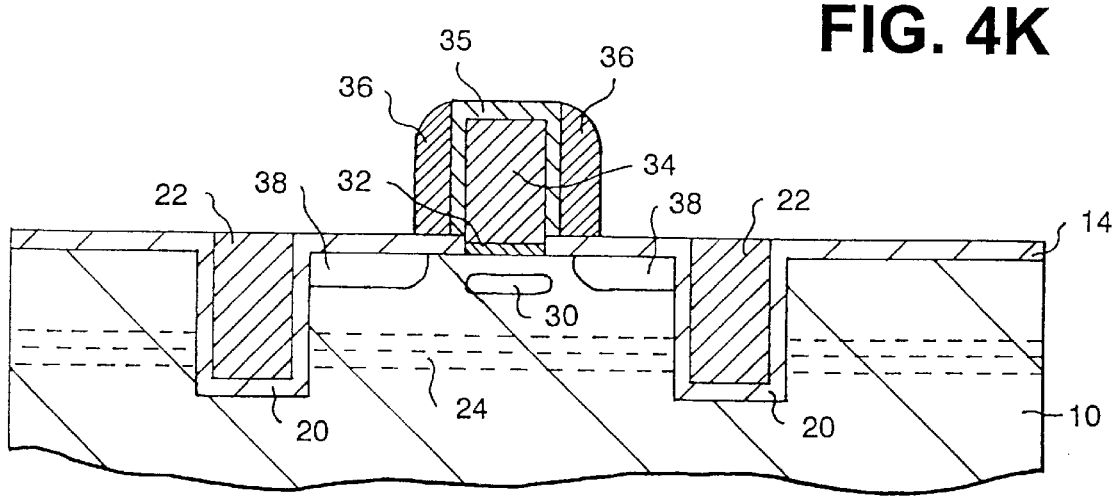

After formation of the nitride spacers on the oxidized sidewalls of polysilicon 34, source/drain regions 38 are formed in' the substrate by conventional ion implantation and the regions are activated utilizing an annealing process in which the annealing temperature is from about 1000° C. or higher for a time period of 5 second or greater, with a temperature from about 1000° to about 1050° C. being preferred. The structure containing the activated source and drain regions is shown in FIG. 4L.

Figure 4M:
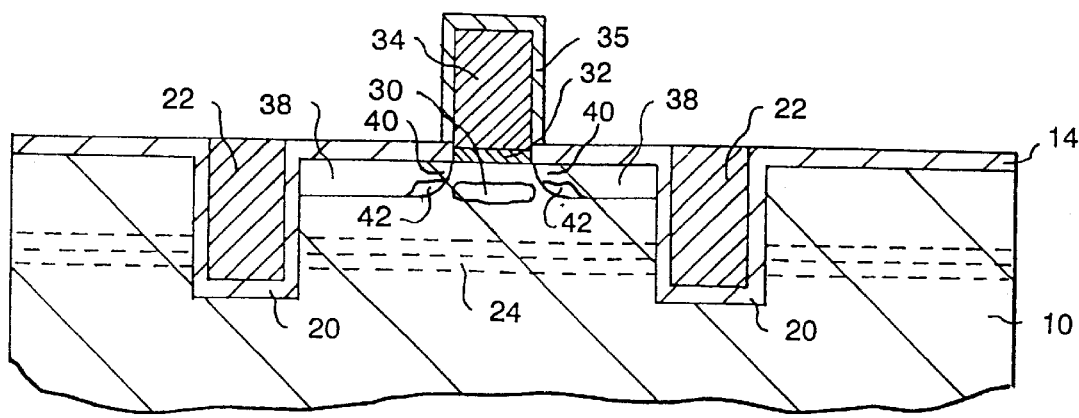

Next, as shown in FIG. 4M, nitride spacers are removed from the structure and source/drain extensions 40 and Super-Halo implants 42 are formed utilizing conventional processes well known in the art. For example, ion implantation and annealing can be employed in forming and activating these regions in the structure. The anneal temperature employed in activating these regions is less than the annealing temperature used in the previous source/drain activation step. Specifically, the annealing temperature employed in activating the source/drain extensions and Super-Halo implants is from about 1000° C. or less for a time period of 1 second or less, with a temperature of from about 900° to about 950° C. being highly preferred.

In one optional embodiment of the present invention, the source/drain extensions are formed after oxidizing the exposed sidewalls of the polysilicon, i.e., polyreoxidation, but prior to removing the nitride spacers.

The structure shown in FIG. 4M may then be subjected to conventional CMOS processing steps which are well known in the art and are described, for example, in R. Colclaser, "Miro Electronics processing and Device Design, Chapter 10, pages 266–269, John Wiley and Sons publisher, 1980.

Figure 5A:
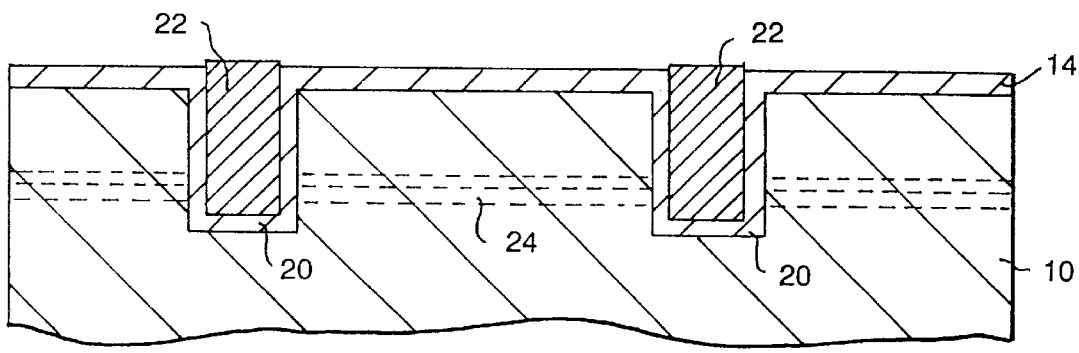
FIGS. 5A–5B are cross-sectional views illustrating the processing steps used in the second method of the present invention which differs from the processing steps used in the first method of the present invention.
Figure 5B:
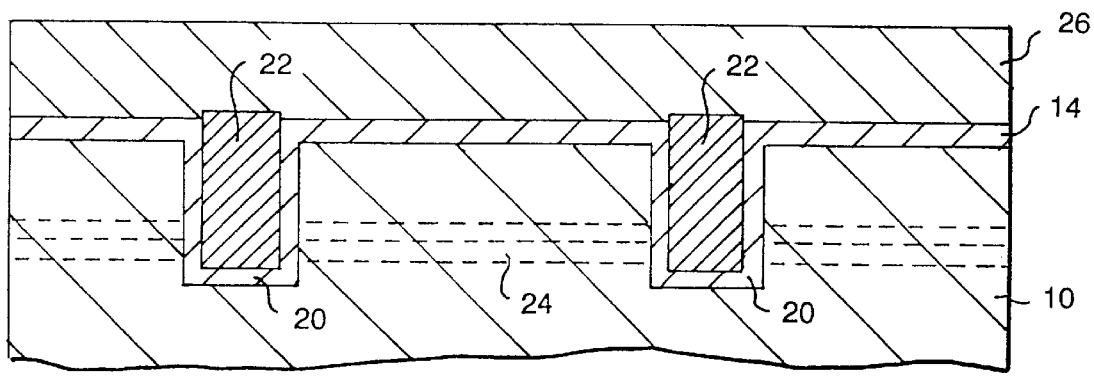

In the second method of the present invention, the processing steps leading up to FIG. 4D are first performed. Next, the trench dielectric material shown in FIG. 4D is then planarized using a conventional planarization processes that is well known to those skilled in the art and then the first nitride layer is removed down to the pad oxide layer using a hot phosphoric etch process providing the structure shown in FIG. 5A. Next as shown in FIG. 5B, second nitride layer 26 is formed on the exposed pad oxide layer of the structure. The second nitride layer is formed using the same processes techniques as previous described herein. The total thickness of second nitride layer 26 in this embodiment of the present invention is substantially equal to the desired height of the gate region. That is, the thickness of the newly deposited second nitride layer is from about 5 to about 200 nm, with a thickness of from about 10 to about 150 nm being more preferred.

The structure shown in FIG. 5B is then processed as is shown in FIGS. 4F–4M (it is noted that when the second method is employed, nitride layers 16 and 26 of FIGS. 4F–4M would be made only from the newly formed second nitride layer).

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by the Letters Patent is:

1. A method of fabricating a sub–0.05 μm MOSFET device having a Super-Halo doping profile comprising the steps of:
   (a) providing a structure having a gate stack formed on a surface of a substrate, said gate stack comprising at least a pad oxide layer formed on said-surface of said substrate and a first nitride layer formed on said pad oxide layer;
   (b) forming at least one isolation trench region in said structure, said at least one isolation trench region being formed in said gate stack and a portion of said substrate;
   (c) forming an oxide liner in said at least one isolation trench region;
   (d) filling said at least one isolation trench region with a trench dielectric material;
   (e) forming well implant regions in said substrate;
   (f) forming a second nitride layer on said first nitride layer of said gate stack, wherein the total thickness of the first nitride layer and the second nitride layer is substantially equal to the thickness of a gate region to be formed subsequently therein;
   (g) forming a gate hole in said first and second nitride layers stopping on said pad oxide layer;
   (h) removing said pad oxide layer in said gate hole exposing a portion of said substrate;
   (i) forming a thin oxide layer in said gate hole on said exposed portion of said substrate, said thin oxide layer having a thickness of 3 nm or less;
   (j) filling said gate hole with polysilicon;
   (k) removing said first and second nitride layers so as to expose sidewalls of said polysilicon;
   (l) oxidizing the exposed sidewalls of said polysilicon including the top surface thereof;
   (m) forming nitride spacers on said oxidized sidewalls of said polysilicon;
   (n) forming source and drain regions in said substrate, wherein said source and drain regions are activated using an annealing temperature of 1000° C. or greater for a time period of 5 seconds or greater;
   (o) removing said nitride spacers; and
   (p) forming source/drain extensions and halo implant regions in said substrate, wherein said halo implant regions are activated by annealing at a temperature of 1000° C. or lower for a time period of 1 second or less.

2. The method of claim 1 wherein said substrate is a semiconducting material selected from the group consisting of Si, Ge, SiGe, GaAs, InAs, InP and layered semiconductors.

3. The method of claim 2 wherein said substrate is a Si wafer or chip.

4. The method of claim 1 wherein said pad oxide layer is formed by a thermal growing process or a deposition process.

5. The method of claim 4 wherein said deposition process is selected from the group consisting of chemical vapor deposition (CVD), plasma-assisted CVD, sputtering and evaporation.

6. The method of claim 1 wherein said pad oxide layer is composed of $SiO_2$.

7. The method of claim 1 wherein said pad oxide layer has a thickness of from about 8 to about 20 nm.

8. The method of claim 1 wherein said nitride layer of said gate stack is formed from a deposition process selected from the consisting of chemical vapor deposition (CVD), plasma-assisted CVD, sputtering and evaporation.

9. The method of claim 1 wherein said nitride layer of said gate stack is composed of $Si_3N_4$.

10. The method of claim 1 wherein said nitride layer of said gate stack has a thickness of from about 50 to about 200 nm.

11. The method of claim 1 wherein said isolation trench is formed by lithography and etching.

12. The method of claim 1 wherein said oxide liner is formed by a deposition process selected from the group consisting of chemical vapor deposition (CVD), plasma-assisted CVD, sputtering and evaporation.

13. The method of claim 1 wherein step (d) includes deposition of said trench dielectric material and planarization.

14. The method of claim 1 wherein said trench dielectric material is a dielectric selected from the group consisting of tetraethylorthosilicate, $SiO_2$ and flowable oxides.

15. The method of claim,1 wherein step (e) comprises ion implantation and annealing.

16. The method of claim 1 wherein said second nitride layer is formed from a deposition process selected from the group consisting of chemical vapor deposition (CVD), plasma-assisted CVD, sputtering and evaporation.

17. The method of claim 1 wherein said gate hole is formed in step (g) by lithography and etching.

18. The method of claim 1 wherein said pad oxide layer is removed from said gate hole by a vapor phase chemical oxide removal process wherein a vapor of HF and $NH_3$ is employed.

19. The method of claim 1 wherein said thin oxide is formed by a gate oxidation process.

20. The method of claim 1 wherein step (j) includes deposition and planarization.

21. The method of claim 1 wherein said nitride layers are removed by a damascene etch back process in which a chemical etchant is employed, said chemical etchant is highly selective in removing oxide.

22. The method of claim 1 wherein said nitride spacers are formed by a deposition process selected from the group consisting of chemical vapor deposition (CVD), plasma-assisted CVD, sputtering and evaporation.

23. The method of claim 1 wherein said nitride spacers are removed by a wet etch process.

24. The method of claim 1 further comprising forming adjust implant regions in said substrate, said adjust implant regions being formed between steps (g) and (h).

25. The method of claim 1 wherein said source/drain extensions are formed between steps (l) and (m) and not in step (p).

26. A method of fabricating a sub–0.05μm MOSFET device having a Super-Halo doping profile comprising the steps of:
   (a) providing a structure having a gate stack formed on a surface of a substrate, said gate stack comprising at least a pad oxide layer formed on said surface of said substrate and a first nitride layer formed on said pad oxide layer;
   (b) forming at least one isolation trench region in said structure, said at least one isolation trench region being formed in said gate stack and a portion of said substrate;
   (c) forming an oxide liner in said at least one isolation trench region;
   (d) filling said at least one isolation trench region with a trench dielectric material;
   (e) forming well implant regions in said substrate;
   (f) planarizing the trench dielectric material;
   (g) removing said first nitride layer stopping on said pad oxide layer;
   (h) forming a second nitride layer over said pad oxide layer, said second nitride layer having a thickness substantially equal to the thickness of a gate region to be formed subsequently therein;
   (i) forming a gate hole in said second nitride layer stopping on said pad oxide layer;
   (j) removing said pad oxide layer in said gate hole exposing a portion of said substrate;
   (k) forming a thin oxide layer in said gate hole on said exposed portion of said substrate, said thin oxide layer having a thickness of 3 nm or less;
   (l) filling said gate hole with polysilicon;
   (m) removing said second nitride layer so as to expose sidewalls of said polysilicon;
   (n) oxidizing the exposed sidewalls of said polysilicon including the top surface thereof;
   (o) forming nitride spacers on said oxidized sidewalls of said polysilicon;
   (p) forming source and drain regions in said substrate, wherein said source and drain regions are activated using an annealing temperature of 1000° C. or greater for a time period of 5 seconds or greater;
   (q) removing said nitride spacers; and
   (r) forming source/drain extensions and halo implant regions in said substrate, wherein said halo implant regions are activated by annealing at a temperature of 1000° C. or lower for a time period of 1 second or less.

27. The method of claim 26 wherein said source/drain extensions are formed between steps (n)–(o) and not in step (r).

* * * * *

UNITED STATES PATENT AND TRADEMARK OFFICE
CERTIFICATE OF CORRECTION

PATENT NO.   : 6,245,619 B1
DATED         : June 12, 2001
INVENTOR(S)  : Hussein I. Hanafi et al.

Page 1 of 1

It is certified that error appears in the above-identified patent and that said Letters Patent is hereby corrected as shown below:

Column 1,
Line 56, "Main problem" should read -- The main problem --

Column 3,
Lines 3 & 4, "surface of said and" should read -- surface of said substrate and --

Column 8,
Line 27, "in ' the" should read -- in the --

Column 9,
Line 28, "said-surface" should read -- said surface --

Column 10,
Line 39, "Claim,1" should read -- Claim 1 --

Signed and Sealed this

Thirtieth Day of April, 2002

Attest:

Attesting Officer

JAMES E. ROGAN
Director of the United States Patent and Trademark Office